United States Patent [19]
Biber et al.

[11] Patent Number: 5,134,311
[45] Date of Patent: Jul. 28, 1992

[54] SELF-ADJUSTING IMPEDANCE MATCHING DRIVER

[75] Inventors: Alice I. Biber, Needham, Mass.; Douglas W. Stout, Milton, Vt.

[73] Assignee: International Business Machines Corporation, Armonk, N.Y.

[21] Appl. No.: 534,406

[22] Filed: Jun. 7, 1990

[51] Int. Cl.⁵ .................. H03K 3/01; H03K 17/16; H03K 5/159

[52] U.S. Cl. .................. 307/270; 307/443; 307/591; 307/594; 307/603; 307/605; 328/55

[58] Field of Search .............. 307/591, 594, 595, 603, 307/605, 443; 328/55, 66

[56] References Cited
U.S. PATENT DOCUMENTS
4,845,390  7/1989  Chan ......................... 307/605

Primary Examiner—Stanley D. Miller
Assistant Examiner—Trong Phan
Attorney, Agent, or Firm—J. Dennis Moore

[57] ABSTRACT

A self-adjusting impedance matching driver for a digital circuit. The driver has both a pull-up gate to VDD and a pull-down gate to ground. An array of gates is provided in parallel with each of the pull-up gate and the pull-down gate, with any one or more of such gates being selectively enabled in response to circuit means that monitors the impedance match between the output of the driver and the network it drives. By enabling selectively such gates, any impedance mismatch can be minimized. The selective enablement may be done only at power up, and thereafter only if the driven network is changed substantially.

3 Claims, 8 Drawing Sheets

| TABLE 1. COMBINATIONS AND CORRESPONDING OUTPUT IMPEDANCE VALUES. | | | | |
|---|---|---|---|---|
| MAIN DRIVER | 1ST (4TH) INCREMENT | 2ND (5TH) INCREMENT | 3RD (6TH) INCREMENT | RESISTANCE |
| ON | OFF | OFF | OFF | 100 OHMS |
| ON | OFF | OFF | ON | 80 OHMS |
| ON | OFF | ON | OFF | 66.7 OHMS |
| ON | OFF | ON | ON | 57.1 OHMS |
| ON | ON | OFF | OFF | 42.9 OHMS |
| ON | ON | OFF | ON | 38.7 OHMS |
| ON | ON | ON | OFF | 35.3 OHMS |
| ON | ON | ON | ON | 32.4 OHMS |

SELF-ADJUSTING IMPEDANCE MATCHING DRIVER

BACKGROUND OF THE INVENTION

1. Field of the Invention

The present invention relates generally to a digital driver circuit, and more particularly relates to a digital driver circuit that drives a network having an unknown impedance within a predetermined range.

2. Background Art

Figure 1:
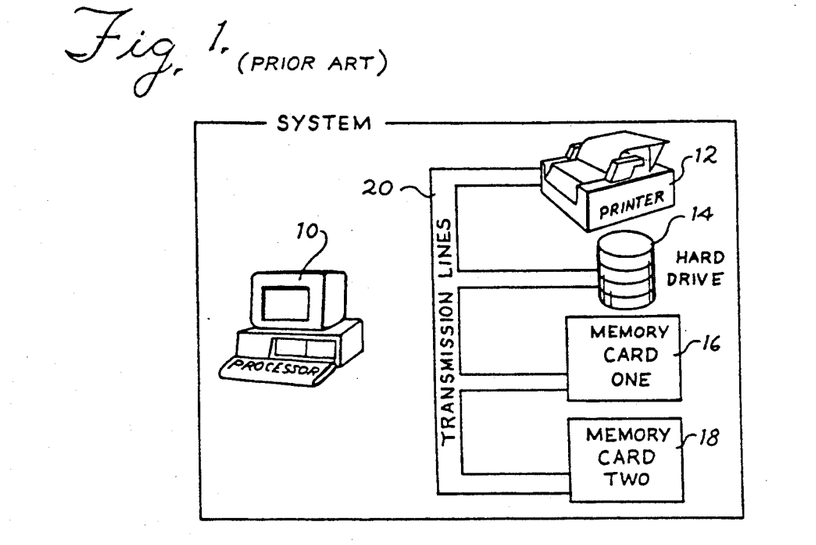
FIG. 1 shows a prior art computer processor system configuration.

Digital drivers in computer processor systems, in particular those drivers that drive signals being placed on open buses, may be called upon to drive a load having an impedance that may be any value within a predetermined range, depending upon the overall computer processor system configuration. For example, consider the computer processor system depicted in FIG. 1. A processor 10, such as a PC, has connected to it typically a number of accessories, such as a printer 12, hard disk drive 14, and memory cards 16 and 18. Signals are sent between the processor 10 and these auxiliary devices by way of one or more buses 20. The number of such auxiliary devices that may be connected to the system buses 20 can vary, depending upon what the user has provided for the system. Depending on the configuration of the system, the impedance seen by any one driver for digital signals from the processor 10 to the buses 20 can be any one of a number of different impedances within a range. In addition, the drivers for bus 20 in printer 12 and in memory card 18 see a characteristic impedance of the buses 20 different from that seen by hard drive 14 and memory card 16, for that one configuration.

Other situations exist within a digital data system wherein a digital driver may see an impedance which may not be known. For example, consider a memory card such as that shown in FIG. 2. Typical memory cards contain two major divisions: The logic modules 24 and the memory modules 26. The logic modules 24 are used to access the memory modules 26 in an organized fashion, to provide control functions, to provide error correction capabilities and direct memory addressing capabilities. Each memory card's memory modules 28 are organized in an array manner. Within this array, they are divided into any number of memory banks, two such memory banks, memory bank A and memory bank B, being shown in FIG. 2.

Figure 2:
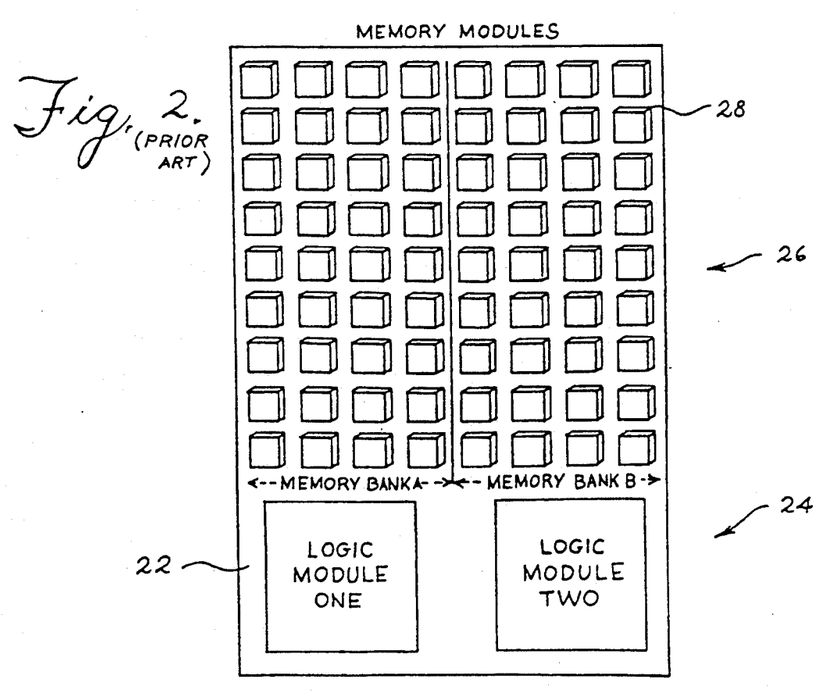
FIG. 2 shows a prior art memory card including two memory module banks, each being driven by a logic module.

Drivers used in this type of a configuration drive signals from the logic modules 24 to the array modules 28. Typically, the signals are driven to ten or twenty modules at a time. A typical card has between forty and eighty modules on it.

A given memory card 22 will have a variable number of modules 28 on it, depending upon how the card is configured. Consequently, the impedance seen by the drivers in the logic modules 24 will vary, depending upon the configuration of the card 22. Nonetheless, the load seen by the driver in the logic modules 24, must be driven properly and with the correct termination. Otherwise, the reflections created by the mismatch must settle out before the signal can be assumed valid, thus increasing the signal delay time. Depending upon the load and driver, such delay could be very long. Hence, in this situation as well it is very important to have the driver impedance match the load impedance.

It can therefore be seen that there is a need for a digital data driver capable of having its impedance adjusted to match a load which may vary, depending upon the configuration of the network it is driving. It would be highly desirable that such driver adjust its impedance without manual intervention.

The present invention meets these needs.

SUMMARY OF THE INVENTION

In a broad sense, the present invention provides a self-adjusting impedance matching driver for a digital circuit that drives a load having an unknown impedance within a predetermined range, that includes a driver for driving digital signals to the digital circuit, the driver having a predetermined impedance. A selectable impedance element coupled to the driver causes selectable changes to the predetermined impedance to a desired, different impedance. A final element coupled to the selectable impedance element senses the impedance difference between the output of the driver and the digital circuit, and selects automatically the impedance for the driver to obtain the optimum impedance match of the driver to the digital circuit.

According to one narrower aspect of the invention, a self-adjusting impedance matching driver is provided for a digital circuit. The driver has an input and an output, and drives a load having an unknown impedance within a predetermined range. A driver amplifier is connected to the driver input. This driver amplifier comprises a pull-up amplifier connected to the supply voltage source for the circuit, and of a pull-down amplifier connected to the circuit ground. A first plurality of transistors is provided, connected in parallel between the output of the driver amplifier and the supply voltage source. The second plurality of transistors is connected in parallel between the output of the driver amplifier and the circuit ground. An element is provided for selectively enabling any combination of the first plurality of transistors and, independently, any combination of the second plurality of transistors, such that any of a plurality of impedances may be selected for the output of the driver, independently for both the pull-up and pull-down transitions of the driver amplifier. Finally, an element is provided for sensing the impedance difference between the output of the driver and the digital circuit, for automatically selecting a first combination of the first plurality of transistors and the second combination of the second plurality of transistors, and for enabling the same. The first and second combinations are selected to provide the optimum impedance match to the particular impedance of the load.

The application of the principles of the present invention is advantageous in configurable systems because the impedance of driver loads can vary greatly from configuration to configuration. Application of the principles disclosed herein improve the noise, overshoot and undershoot problems by matching the load. Further advantages are obtained because the present invention automatically adjusts the output impedance of the driver to the impedance of the circuit that it drives.

The foregoing and other objects, features, aspects and advantages of the invention will be apparent from the following more particular description of the preferred embodiments of the invention, as illustrated in the accompanying drawings.

DETAILED DESCRIPTION OF THE PREFERRED EMBODIMENTS

Figure 3:
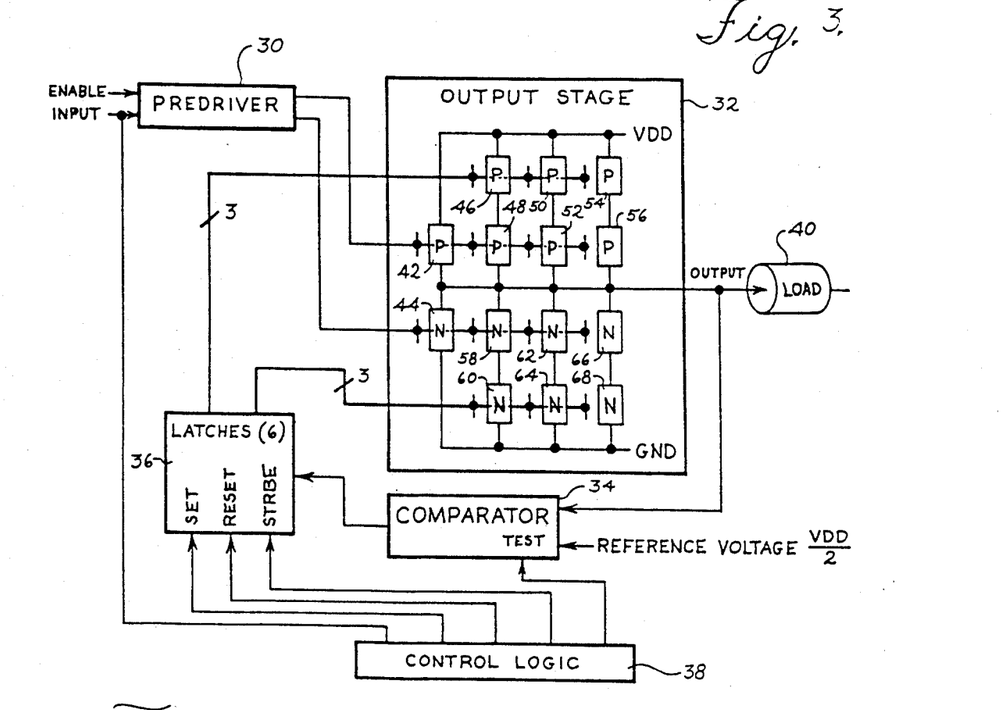
FIG. 3 is a block diagram of a preferred embodiment of the present invention.

FIG. 3 is a block diagram of the preferred embodiment of the present invention. The basic components are a predriver 30, an output stage 32, a comparator 34, a set of latches 36 and a control logic block 38. The output of the output stage 32 drives a load 40 which, in general, has a fixed, but unknown impedance within a known range.

The output stage 32 comprises an array of p-type and n-type MOS transistors, the preferred embodiment being implemented in CMOS technology. The primary driver devices are p-type device 42 and n-type device 44. Device 42 is a pull-up transistor, while device 44 is a pull-down transistor. VDD is the circuit supply voltage, GND being circuit ground. Also included in output stage 32 are three pairs of p-type devices 46–48, 50–52 and 54–56, connected between the output line and VDD. Devices 48, 52 and 56 are gated by the output of predriver 30, while devices 46, 50 and 54 are gated independently by the outputs of the set of latches 36. Likewise, three pairs of n-type devices 58–60, 62–64 and 66–68 are provided between the output line and ground, the operation thereof being similar to that of the three pairs of p-type devices just described.

The primary driver devices 42, 44 have a characteristic impedance equal to the highest anticipated impedance to be presented under normal conditions by load 40. Each of the pairs of devices just described has a preselected characteristic impedance which, when added in parallel to the impedance of devices 42 and 44, as the case may be, serves to reduce the characteristic impedance of the output stage 32 in a selectable manner. The addition or omission of the pairs of devices just described, referred to herein as "incremental impedance pairs," or "incremental impedance devices," is controlled by the operation of the set of latches 36 under control of the control logic 38, in a manner which is described below.

In a test iteration, an input signal and an enable signal are applied to the predriver 30 causing an output signal to appear on the output of output stage 32. Sufficient time is allowed for the enabled input signal to propagate through the drive circuitry, and for any transient components to substantially subside at the output. The output signal is then considered to be at a "plateau". This output signal plateau voltage is applied to comparator 34 where it is compared against a reference voltage. When the impedance of output stage 32 and the impedance of load 40 are substantially the same, representing a balanced impedance condition, the voltage appearing at the output of output stage 32 is substantially one half of VDD. Thus, the reference voltage is set at VDD/2.

The test sequence continues through several tests in which the aforementioned voltage comparison is made. All incremental impedance pairs are initially on. In any such test, if the result of the comparison is, in the case of the p-type devices, that the output voltage is more than the reference voltage (less, in the case of the n-type devices), additional gate pairs are incrementally gated off subtracting impedance in parallel with the impedance with the primary output driver devices 42, 44. When the result of the comparison is the opposite, additional gate pairs are left on.

The impedances associated with the respective incremental impedance pairs are not all the same. Rather, they are provided in values spanning roughly continuously across a range, from highest to lowest, representing, in a sense, the least significant bit to most significant bit of incremental impedance contribution. According to one embodiment, a successive approximation algorithm is utilized to determine which pairs of gates are enabled to adjust the impedance to its optimum value. Rather than simply turning on the gate pair representing the highest impedance, and then continuing successively to that having the smallest resistance, or vice versa, all gate pairs are initially turned on. The gate pair having the smallest impedance, representing the most significant bit, is then turned off first, setting the overall impedance in the midrange of the entire range. This divides the range of all possible impedance values for the output stage 32 into two sections: High and Low. The test is then conducted, which determines whether to go higher or lower in impedance, i.e., whether this most significant bit of incremental impedance is to remain off, or be turned back on. According to successive approximation, after making this first impedance adjustment, the range of potentially optimal resistances is divided again into two sections as before by turning off the next less significant bit of incremental impedance, the test is made, and so forth.

In an arrangement such as that shown in FIG. 3, wherein three additional incremental impedances are provided, the impedance should approximately, and optimally for this configuration, match the load impedance after the third iteration of this successive approximation algorithm. This impedance matching scheme can match up to eight different resistances by sending out just three pulses (the pull-up portion is matched on the rising transitions and the pull-down portion is matched on the falling transitions).

Typical impedance values in conventional digital circuitry requiring I/O drivers range from 20 to 100 ohms. Using this range in the preferred embodiment allows the designer to use this driver in almost all situations without having to worry about the impedance. As mentioned above, with three bits there are eight different resistances. However, the weighting of the incremental impedance values determines the spread of the resistances. The preferred embodiment was developed for use in a design system that previously provided impedances of 20, 40, and 80 ohms. Consequently, an attempt was made to provide these specific values. However, practical considerations lead to the dropping of the 20 ohm value. Since process variations change the resistances of the MOS devices utilized, the highest impedance should be set around 100 ohms, because the highest impedance seen by the driver will be actually around 85 ohms. With all the incremental impedance added, thereby achieving the lowest impedance, providing the necessary incremental impedance to get the overall impedance down to 20 ohms requires devices that are impractically large. Therefore, for the preferred embodiment the sizes were chosen so that resistances range from 32 ohms to 100 ohms in a nominal process.

As process conditions vary to the extremes, the device sizes chosen do not yield the same resistance values, but since this circuitry exploits feedback the matching scheme still works. In fact, the scheme has proven to work well under nominal test case conditions.

Figure 4:
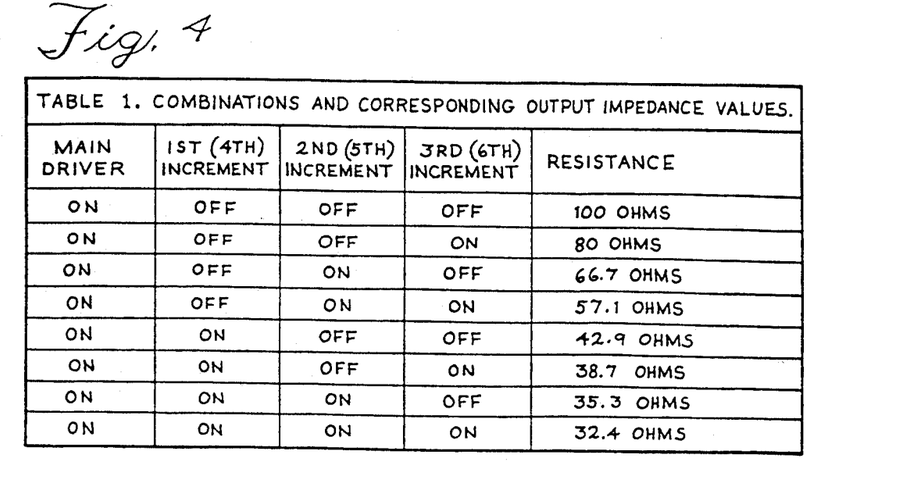
FIG. 4 is a table showing combinations and corresponding output impedance values for various selections of the transistors shown in FIG. 3.

The target resistance values in the preferred embodiment of the present invention are as follows: (a) The main driver 100 ohms, (b) first increment 75 ohms, (c) second increment 200 ohms, (d) third increment 400 ohms. These resistances provide output impedances in the range of 100 to 32 ohms, as shown in Table One (FIG. 4).

The following is a more detailed description of each of the elements of the driver shown in driver 3.

Figure 5:
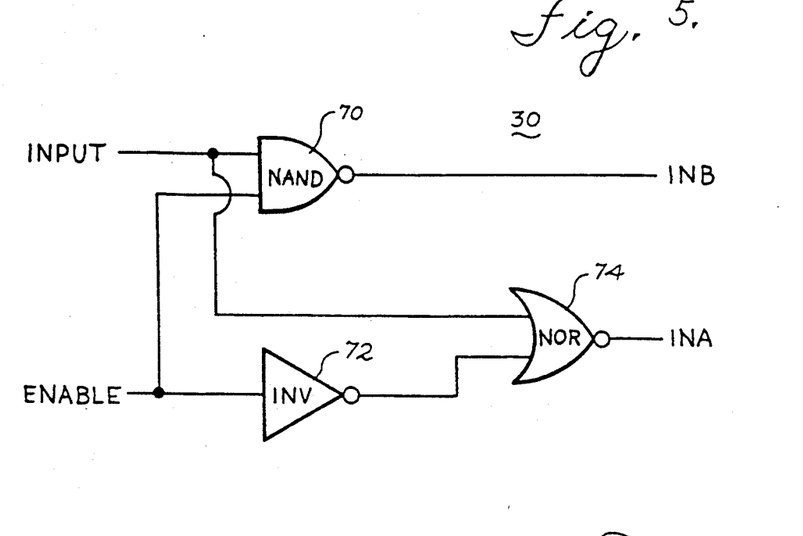
FIG. 5 is a logic diagram of the predriver stage shown in FIG. 3.

FIG. 5 is a logic diagram of predriver 30 shown in FIG. 3. The function of the predriver is to gate the driver enable signal with the driver input signal, while still allowing the output stage to provide a high impedance signal. This is accomplished by the utilization of NAND gate 70, inverter 72 and NOR gate 74, interconnected as shown Predriver 30 ensures that: a) With logic input "1" only the pull-up devices are turned on, b) with logic input "0" only the pull-down devices are turned on, and c) in the high impedance state both the pull-up and pull-down devices are turned off, all of which is conventional for a so-called three-state driver.

Figure 6:
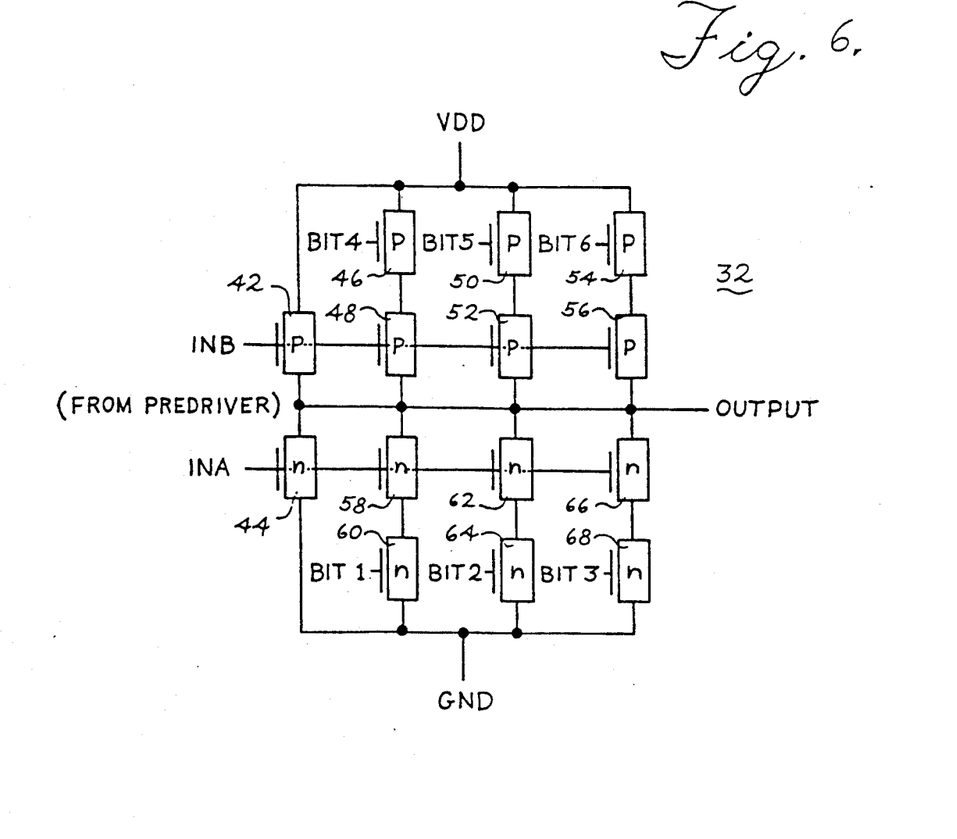
FIG. 6 is a circuit diagram of the output stage of the driver shown in FIG. 3.

FIG. 6 shows the output-stage 32 of FIG. 3. The function of the output stage 32 is to provide current for the load. To optimize performance, the output stage 32 is used by the feedback circuitry (comparator 34, latches stage 36, and predriver 30) to match the impedance to that of the load 40.

As described above, incremental impedance components are provided as pairs of devices, for example p-type devices 46 and 48, that are enabled to add their incremental impedance in parallel with the other driver output impedance to reduce the overall output impedance by a predetermined amount. The signal lines BIT1-6 control this enabling, and are provided from the latch circuits described below in connection with FIGS. 8A and 8B.

Figure 7:
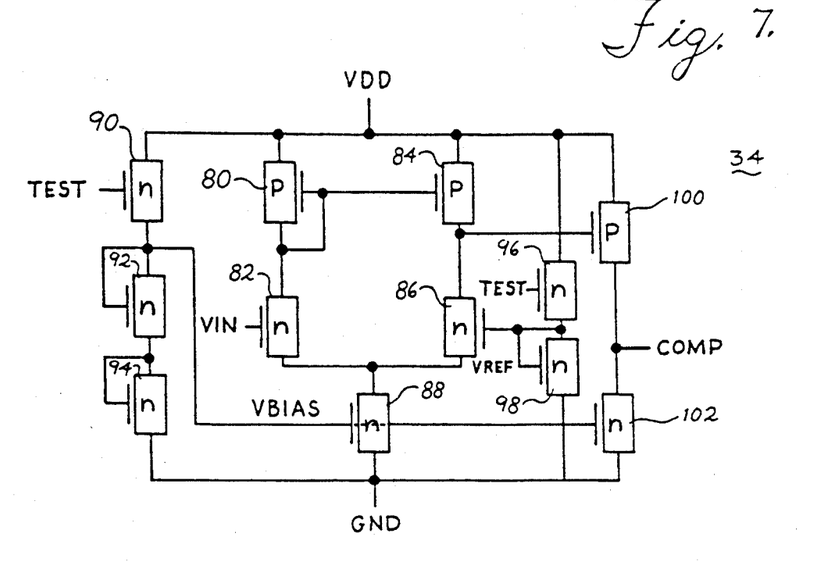
FIG. 7 is a circuit diagram of the comparator shown in FIG. 3.

FIG. 7 is a circuit diagram of comparator 34 of FIG. 3. Transistors 80, 82, 84, 86 and 88 comprise a conventional MOS differential amplifier. Devices 90, 92 and 94 comprise a voltage bias string that sets the bias for devices 88 and 102, device 90 also providing a switching function to turn the string on and off. The reference voltage, VREF, for the aforementioned comparison function is set by devices 96 and 98, also comprising a voltage bias string. Finally, devices 100 and 102 comprise an amplifier stage which, in addition to providing amplification also provides a level shift so that the output switches around a center at VDD/2. The output signal, COMP, is inverted and provided to the latches, as described below.

Figure 8A:
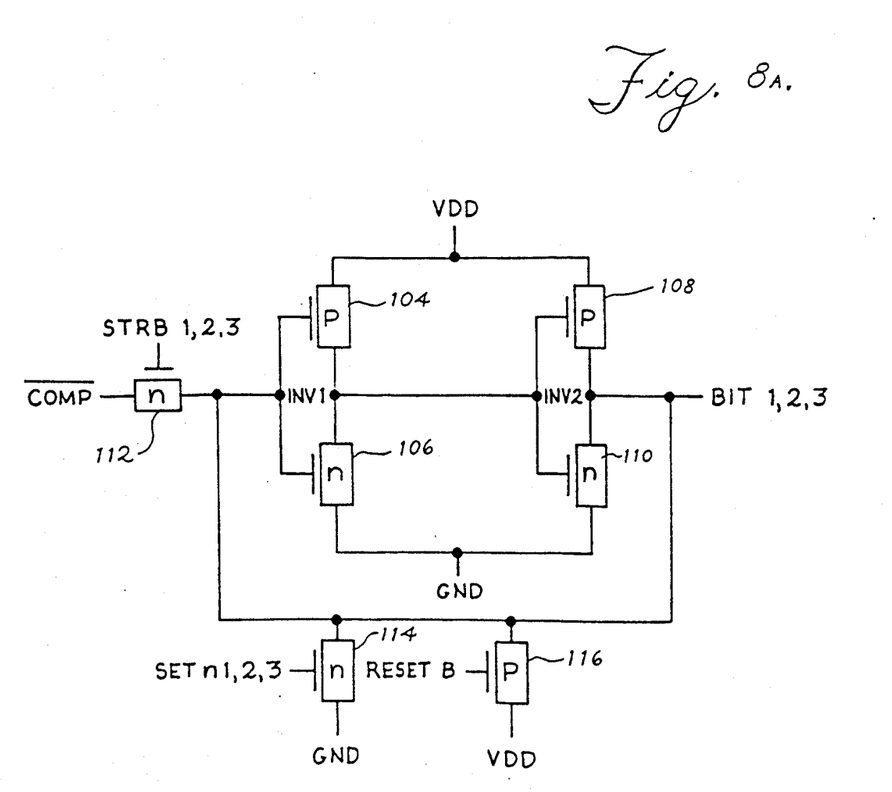
FIGS. 8A and 8B are circuit diagrams of two latch circuits employed in the set of latches 36 shown in FIG. 3.
Figure 8B:
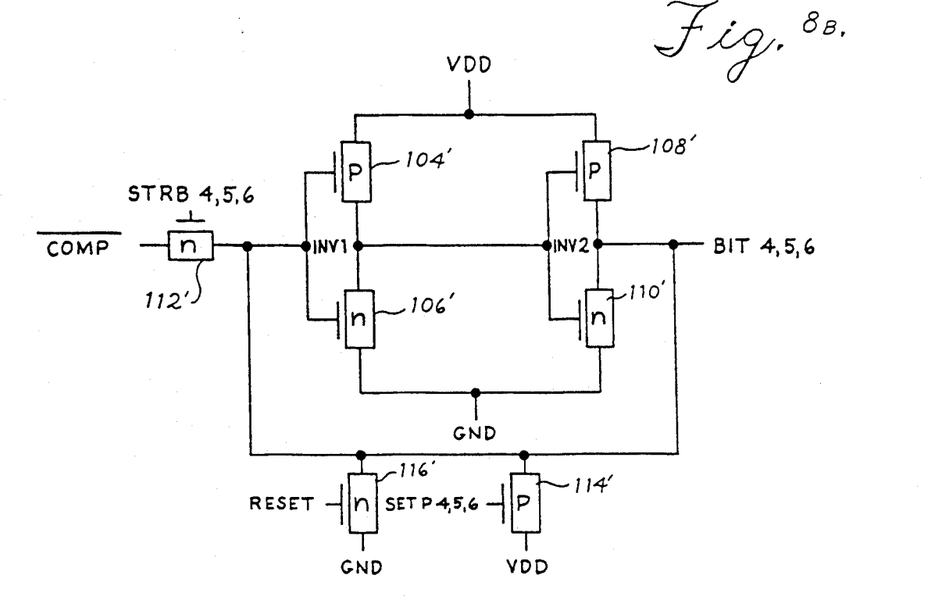

FIGS. 8A and 8B are circuit diagrams of the two kinds of latches employed in the set of latches 36 shown in FIG. 3. Three sets are used in set 36. The latch shown in FIG. 8A, hereinafter referred to as latch 1, 2 or 3, as the case may be, is used to control the inclusion or omission of the device pairs 58-60, 62-64, and 66-68, respectively, shown in FIG. 3, hereinafter designated as n-pair 1, 2 and 3. The latch shown in FIG. 8B, hereinafter referred to as latch 4, 5 or 6, as the case may be, is used to control the inclusion or deletion of gate pairs 46-48, 50-52 and 54-56, respectively, shown in FIG. 3, hereinafter referred to as p-pairs 4, 5 and 6.

Referring now to FIG. 8A, devices 104, 106, 108 and 110 comprise a conventional latch, with devices 112, 114 and 116 providing strobe, set, and reset functions, respectively. The strobe signal applied to device 112, STRB1, 2 or 3, as the case may be, enables latching of the data signal "COMP," at the input of the latch. The circuit for generating the strobe signal is described below. The input signal is the inverted output signal from the comparator circuit described above in connection with FIG. 7. Each of the latches 1, 2 and 3, having the configuration shown in FIG. 8A gets, respectively, one of the signals SETN1, SETN2, or SETN3, as the case may be. These signals enable the strobing of the results of the comparator test to the latch, thus enabling the deletion of the associated gate pair from the output stage 32 in the sequence described above. The RESETB signal simply provides a reset function for the latch.

FIG. 8B is a circuit diagram for latches 4, 5 and 6 of set 36. The operation of this latch circuit is substantially the same as that as the circuit described above in connection with FIG. 8A. However, the polarities of the devices 114' and 116' are reversed from those of devices 114 and 116 of FIG. 8A, to accommodate the different device polarities of device pairs 46-48, 50-52 and 54-56. Otherwise, operation of the circuit is the same.

Figure 9:
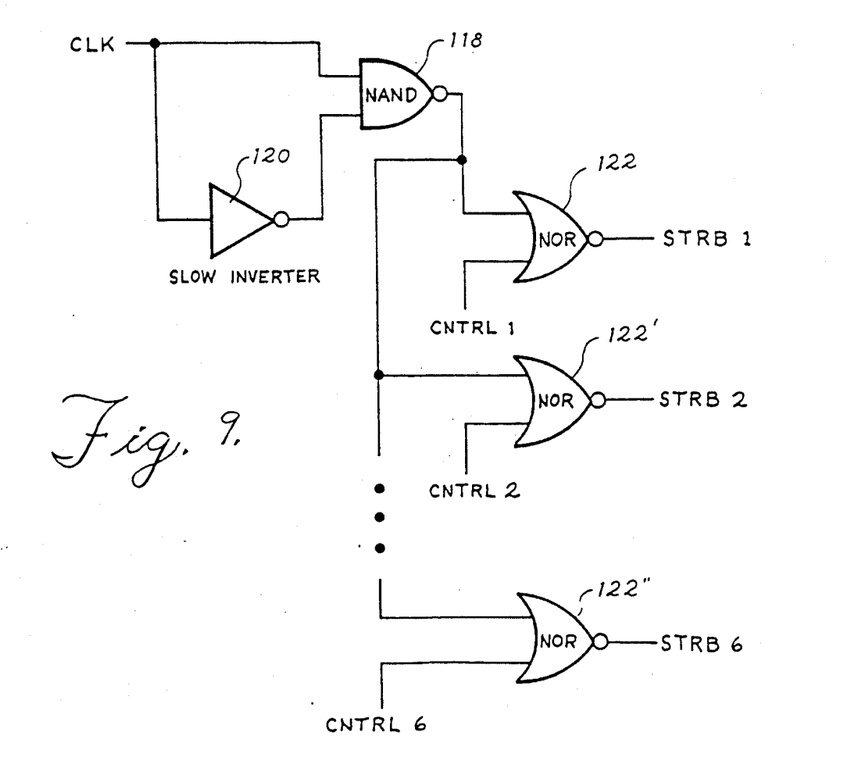
FIG. 9 is a circuit diagram of a timing generation circuit used in the embodiment shown in FIG. 3.

FIG. 9 is a block diagram of the timing circuits used to generate the aforementioned strobe signal from the system clock. The clock signal is applied to a first input of a NAND gate 118, and to a slow inverter 120, the output of which is connected to the second input of NAND gate 118. The circuit comprising manner gate 118 and slow inverter 120 is effectively a one shot circuit. The output of NAND gate 118 is provided to a first input of NOR gate 122 associated with latch 1, while a control signal from control logic 38 (FIG. 3) is provided to the second input thereof. The output of NOR gate 122 is the strobe signal for latch 1. It should be noted that in a given IC, the inverter 120 and NAND gate 118 are provided only once, with NOR gate 122 being provided in parallel for each latch in latch set 36, as shown by NOR gates 122', 122".

The operation of the control logic 38 in FIG. 3 will now be described. Control logic 38 is comprised of conventional logic circuitry, the particular configuration of which is well within the design skills of one of ordinary skill in this art. The particular circuit configuration is not particularly pertinent, the significant aspect of control logic 38 being the timing of the various signals produced thereby and applied to the other parts of the circuit shown in FIG. 3. It should be noted that in adapting the preferred embodiment to its design system, the control logic 38 is provided only once for a given IC circuit, the remainder of the driver circuitry being provided with each driver throughout the IC circuit.

The control logic 38 sends out test voltage pulses, and when the impedance matching is complete turns the feedback circuity off. Control logic 38 carries out the sequence of tests involved in impedance matching the output stage 32 to the load, as described above. The control logic 38 is the interface between the digital data system (not shown) and the driver, and is intended to be transparent to the system, except that the system, after powering up, sends a signal to the control logic 38 causing the control logic 38 to initiate the test sequence, after which the control logic sends a signal to the system indicating that set-up is complete.

Figure 10:
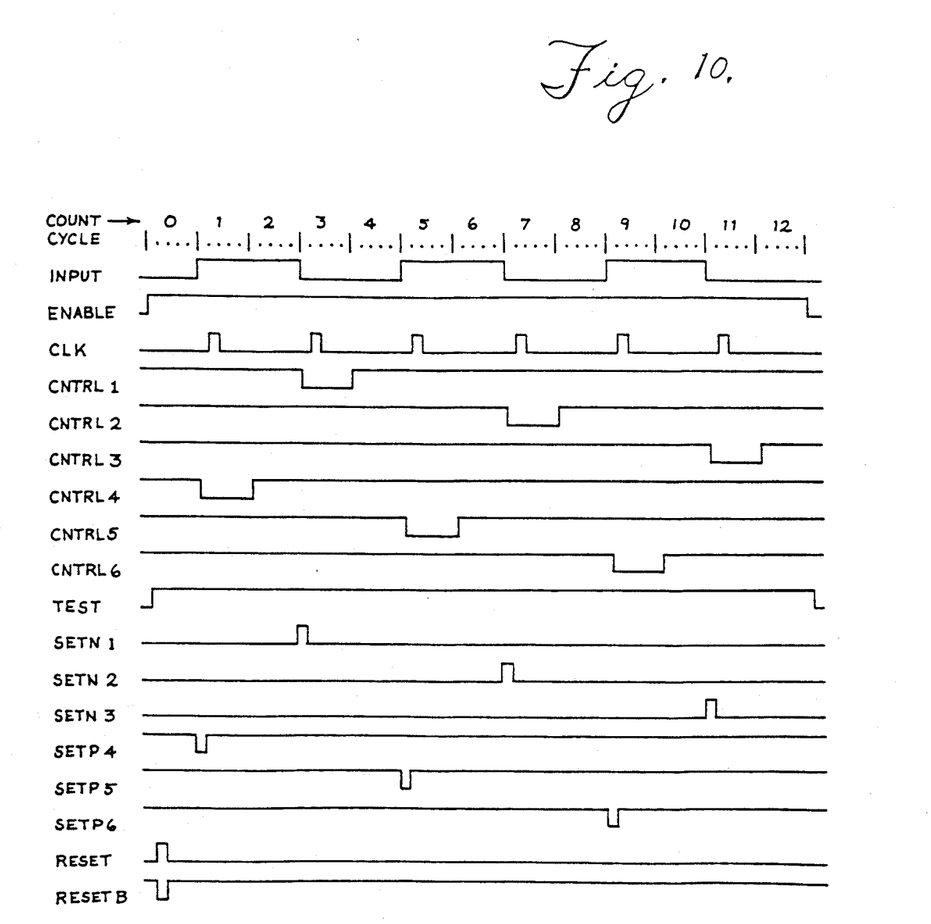
FIG. 10 is a diagram showing control circuitry critical timing for the implementation depicted in FIG. 3.

Referring now to FIG. 10, initially the Enable signal is activated to allow the predriver 30 (FIG. 3) to send data signals to the output stage 32, rather than remain in a high impedance state. At the same time the Test signal is applied, which powers up the comparator 34. Following this, the RESET and RESETB signals are pulsed, causing the latches 36 to be set in a state which causes all the incremental impedance gate pairs in the output stage 32 to be enabled.

Then the SETP4 line is pulsed, setting the latch associated with the most significant bit of p-channel impedance, latch 4, removing it from the output stage 32.

Next, a positive going input pulse is applied to the Input line of the predriver 30. Shortly thereafter the CNRTL4 line is brought low, and the CLK signal is pulsed, capturing the results of the comparator 34 comparison in the latch associated with bit 4, allowing for propagation delays and settling of the output signal, the timing of this being determined by the CLK signal.

The SETN1 signal is then pulsed, turning off the most significant bit of n-channel impedance, followed by the negative going transition of the Input signal, the CNTRL1 signal, and the CLK signal, as above, capturing the results of the test in the latch associated with bit 1.

The sequence continues, alternating between p-channel and n-channel test, testing with respect to the next significant bit, and finally, the least significant bit, completing the test.

Figure 11A:
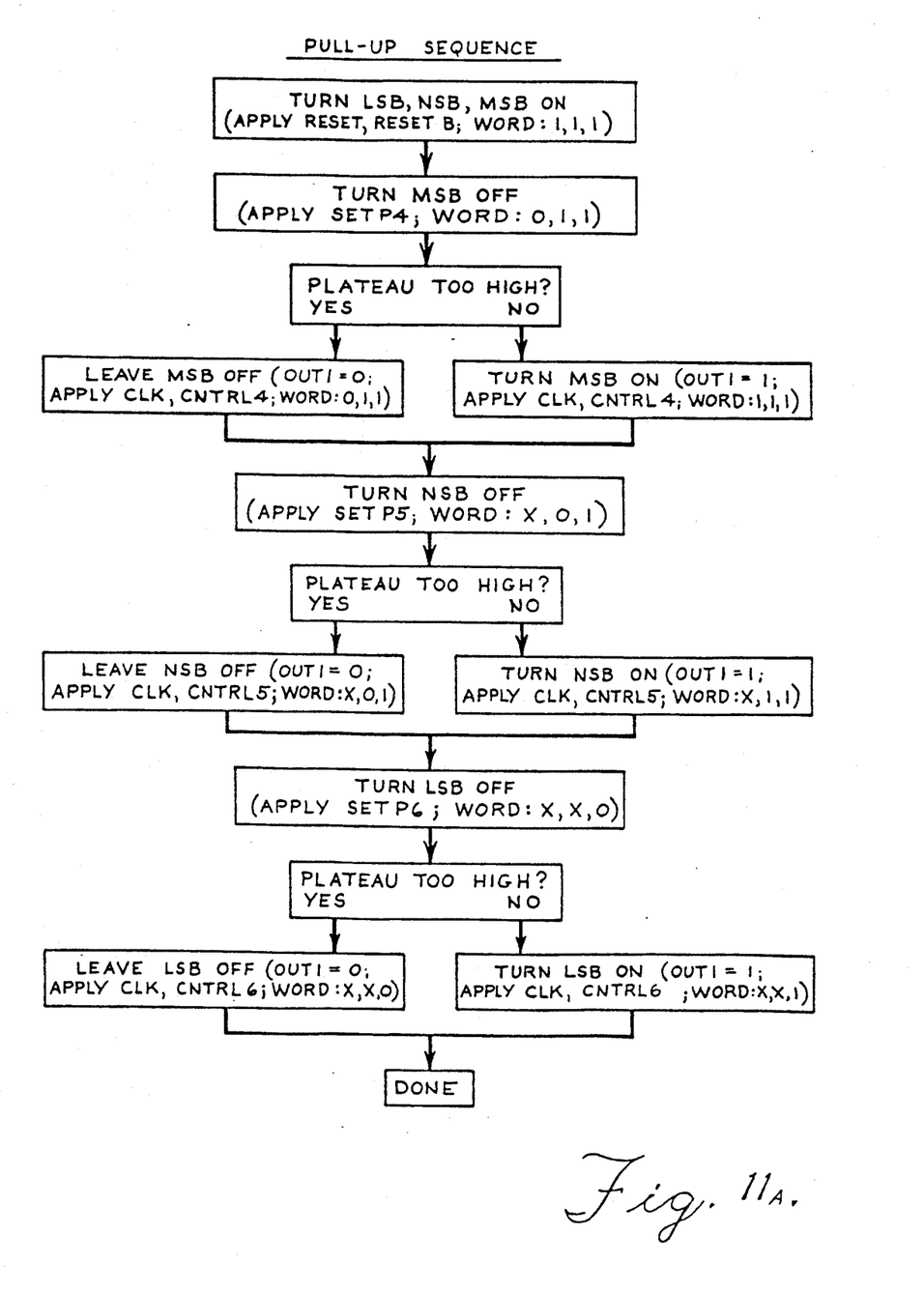
FIGS. 11A and 11B are flow chart diagrams illustrating the sequence of events for pull-up pairs and pull-down pairs of gates, respectively.
Figure 11B:
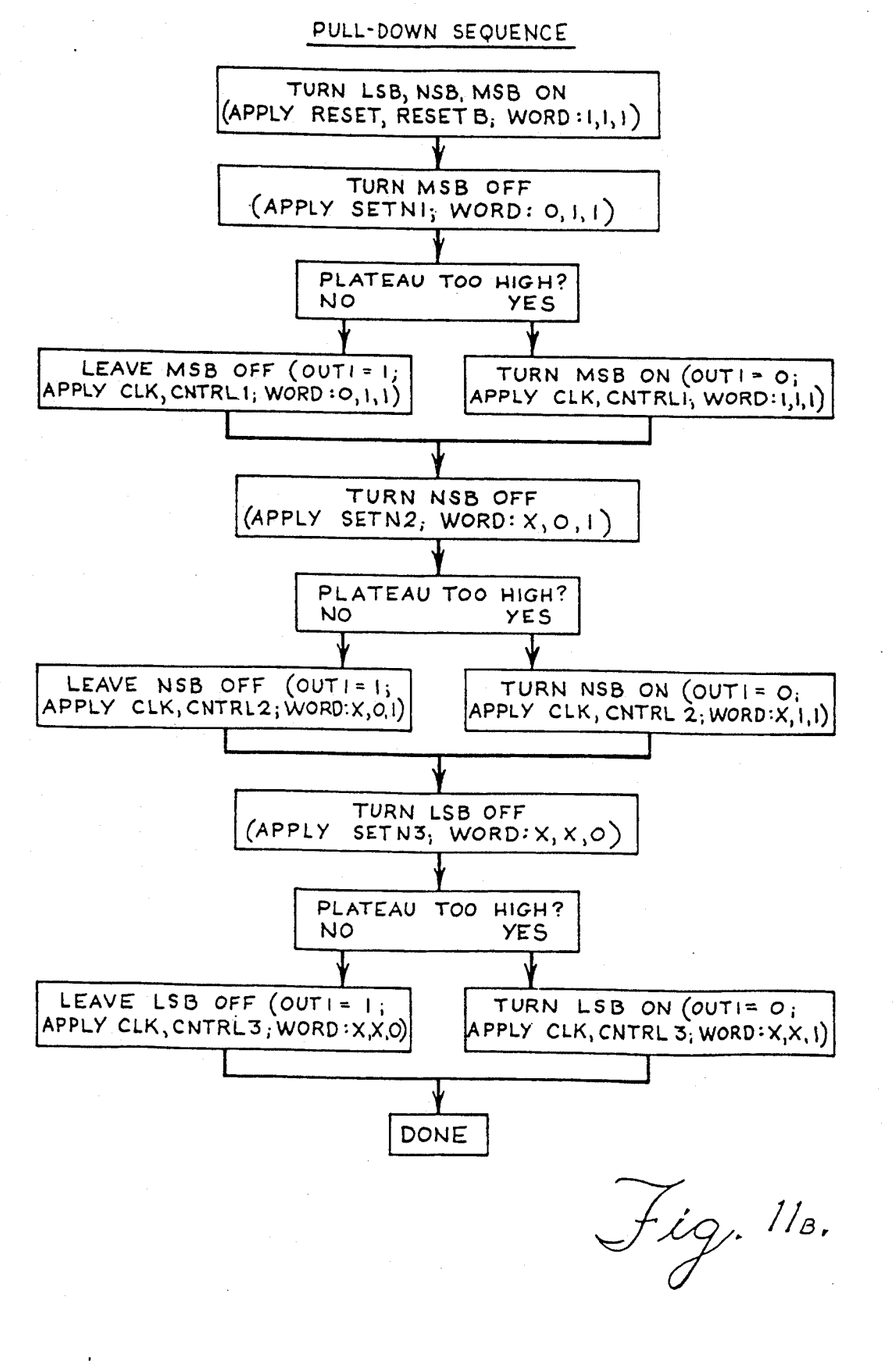

FIG. 11A is a flow chart illustrating the above-described sequence in terms of logic flow, and connecting the logic flow to the sequence of signals, for the pull-up incremental impedance pairs. FIG. 11B is a flow chart like that of FIG. 11A, but for the pull-down pairs. In implementation, these charts are, in effect, "interleaved," as the test proceeds alternatingly on "rising" transitions and "falling" transitions of the input signal, adjusting alternately the pull-up pairs and then the pull-down pairs, incrementally.

In FIGS. 11A and 11B, reference is made to "word." This word corresponds to the three bits of incremental impedance, indicating whether a particular incremental impedance pair in "ON" (bit "1") or "OFF" (bit "0"). A value of "X" indicates that in that branch of the flow chart, such bit has whatever value was set for that bit position in the previous operation or operations. Thus, a word value of 1, 0, 1 corresponds to a condition where the most and least significant bit are "ON," while the "next" significant bit is "OFF." Also, a word value of 1, X, 0 corresponds to a condition where the most significant bit is "ON," the least significant bit is "OFF," and the next significant bit is whatever value it was set in the previous operation or operations. Refer to Table 1 (FIG. 4) for the next output impedance value any particular word value represents.

While the invention has been particularly shown and described with reference to referred embodiments thereof, it will be understood by those skilled in the art that various changes in form and details may be made therein without departing from the spirit and scope of the invention. For example, it should be understood that modifications with respect to the number of impedance increments may be made, as well as with respect to their value. In addition, other techniques may exist or advances in technology may provide new ways of changing the output impedance that may be applied, and still not depart from the spirit and scope of the invention. These and all such other changes in form and detail are understood to be within the scope of the invention claimed herein.

What is claimed:

1. In a digital circuit, a self-adjusting impedance matching driver, driving a load having an unknown impedance within a predetermined range, comprising:
    driver means for driving digital signals to the load, said driver means having a predetermined impedance;
    said driver means including selectable impedance means for changing said predetermined impedance to a different, selected impedance within said predetermined range; and
    means coupled to said driver means for sensing the impedance difference between the output of said driver means and the load and for modifying automatically said selectable impedance means to a different impedance to obtain the optimum impedance match of said driver means to the load.

2. In a digital circuit, a self-adjusting impedance matching driver, having an input and an output and driving a load having an unknown impedance within a predetermined range, comprising:
    a driver amplifier connected to said driver input, comprising a pull-up amplifier connected to the supply voltage source and a pull-down amplifier connected to the circuit ground;
    a first plurality of gates connected in parallel between the output of said driver amplifier and the supply voltage source;
    a second plurality of gates connected in parallel between the output of said driver amplifier and the circuit ground;
    means for selectively enabling any combination of said first plurality of gates and, independently, any combination cf said second plurality of gates, such that any of a plurality of impedances may be selected for the output of said driver, independently for both the pull-up and pull-down transitions of said driver amplifier; and
    means for sensing the impedance difference between the output of said driver and the load, for automatically selecting a first combination of said first plurality of gates and a second combination of said second plurality of gates and for enabling same, said first and second combinations being selected to provide the optimum impedance match to the particular impedance of the load.

3. In a digital circuit, a self-adjusting impedance matching driver for a digital circuit, driving a load having an unknown impedance within a predetermined range, comprising:
    driver means for driving digital signals to the load, said driver means including pull up means for pulling the output of said driver means to the circuit supply voltage level, and including pull down means for pulling the output of said driver means to the circuit ground level;

first and second selectable impedance means coupled to said driver means for changing the pull up means impedance and the pull down means impedance in a predetermined manner; and sensing means for sensing the impedance difference between said driver means and the load and for automatically causing said first and second selectable impedance means to select the optimum impedance for said pull up means and for said pull down means to cause an optimum match of said driver means output impedance to said load.

* * * * *